United States Patent [19]
Burrows et al.

[11] Patent Number: 6,034,537
[45] Date of Patent: Mar. 7, 2000

[54] DRIVER CIRCUITS

[75] Inventors: David Frank Burrows, Godalming; Kenneth Stephen Hunt, Camberley, both of United Kingdom

[73] Assignee: LSI Logic Corporation, Milpitas, Calif.

[21] Appl. No.: 08/965,129

[22] Filed: Nov. 6, 1997

[30] Foreign Application Priority Data

Nov. 12, 1996 [GB] United Kingdom ............... 9623556

[51] Int. Cl.[7] .................. H03K 19/003; H03K 17/16
[52] U.S. Cl. .......................... 326/33; 326/34; 326/80; 326/82
[58] Field of Search ............... 326/33, 34, 80, 326/81, 83, 86, 87, 90

[56] References Cited

U.S. PATENT DOCUMENTS

| | | | |
|---|---|---|---|
| 4,880,997 | 11/1989 | Steele | 326/27 |
| 5,034,625 | 7/1991 | Min et al. | 327/536 |
| 5,248,907 | 9/1993 | Lin et al. | 326/33 |
| 5,266,848 | 11/1993 | Nakagome et al. | 307/475 |
| 5,280,196 | 1/1994 | Shinozaki | 326/112 |
| 5,382,843 | 1/1995 | Gucyski | 326/109 |
| 5,500,817 | 3/1996 | McLaury | 365/189.05 |
| 5,614,859 | 3/1997 | Ong | 327/333 |
| 5,668,483 | 9/1997 | Roohparvar | 326/34 |
| 5,703,500 | 12/1997 | Vo | 326/71 |
| 5,831,447 | 11/1998 | Chaw | 326/27 |
| 5,900,741 | 5/1999 | Roohparvar | 326/34 |

FOREIGN PATENT DOCUMENTS

| | | |
|---|---|---|
| 0539593 | 5/1993 | European Pat. Off. . |
| 2300531 | 6/1996 | United Kingdom . |

*Primary Examiner*—Michael Tokar
*Assistant Examiner*—Daniel D. Chang

[57] ABSTRACT

A driver circuit has first and second output drivers, monitor circuitry for deriving control signals related to driven signal levels, and supply circuitry responsive to the control signals for controlling the supply voltage to the output drivers. The monitor circuitry can be connected to monitor the voltage at the supply inputs of the output drivers for deriving the control signals. Alternatively, the monitor circuitry can be connected directly to monitor driven output levels from the drivers. In the latter case, the output levels to be monitored are rectified. The monitor circuitry can comprise first and second operational amplifiers for comparing a monitored voltage from first and second output drivers, respectively, to a first and second reference voltages, respectively. The supply circuitry can comprise first and second constant current sources, for example field effect transistors.

10 Claims, 8 Drawing Sheets

DRIVER CIRCUITS

BACKGROUND OF THE INVENTION

1. Field of the Invention

The invention relates to driver circuits and to integrated circuits including such driver circuits.

2. Description of the Prior Art

A typical driver circuit comprises one or more devices which are driven (alternately) into saturation. The accompanying FIG. 1 illustrates a typical CMOS output driver stage of a driver circuit 10 comprising a first output driver 12, here a PMOS transistor 12, and a second output driver, here an NMOS transistor 14 in series between a high voltage supply Vdd 16 and a low voltage supply Vss 18. The PMOS and NMOS transistors 12 and 14 are alternatively driven into saturation by a signal A supplied at an input 20. The driven signal Y is output at 22 to I/O devices 24.

The operation of the driver stage of FIG. 1 will now be described. Consider the situation where signal A is low. The gate of the PMOS device 12 will be low, which turns the PMOS device 12 on and provides a low impedance path from the output at 22 to the high voltage line Vdd 16. At this time, the NMOS device 14 is turned off. Accordingly, the signal at the output 22 goes high providing a high driven signal. When the signal A is high, the gate of the NMOS device 14 is turned on, providing a low impedance path from the output 22 to the low voltage line Vss 18. At this time, the PMOS device 12 is turned off. Accordingly, the signal at the output 22 goes low providing a low signal Y.

A problem arises when the supply at Vdd or at Vss varies. Unwanted variations can result from DC drift, Vdd or Vss supply or ground "bounce", or other effects. This can occur, for example, due to electromagnetic interference, or to noise spikes caused in the circuitry of an integrated circuit of which the driver stage forms a part. Accordingly, rather than there being a fixed voltage level at Vdd and another fixed voltage level at Vss, the voltages at either or both of these supply lines 16 and 18 can vary significantly, and independently of one another. Accordingly, since the output 22 is always connected via a low impedance path directly to either Vdd or Vss, any supply variations will be translated directed into unwanted variations on the output level of the signal Y. Typically, in straight CMOS-CMOS applications, a receiver stage which is downstream of the driver stage is tolerant of this noise until it exceeds half the supply rail voltage, at which time the receiver will erroneously receive the wrong voltage level and will switch accordingly.

FIG. 2 illustrates another type of prior art output driver circuit 30 which employs a "bridge" circuit, as is typically associated with high power electric motor drives. It has been proposed to use the circuit of FIG. 2 as a high speed driver circuit.

In FIG. 2, the bridge arrangement 32 comprises a first output driver 34 formed by a pair of PMOS output drive devices 38 and 40 and a second output driver 36 formed by a pair of NMOS output drive devices 42 and 44. A first PMOS device 38 is connected between the supply line 16 and a first output line 60. A second PMOS device 40 is connected between the high voltage supply line 16 and a second output line 62. A first NMOS device 42 is connected between the low voltage supply line 18 and the first output line 60. A second NMOS device 44 is connected between the low voltage supply line 18 and the second output line 62. Signals A and $\overline{A}$ are provided for controlling the PMOS and NMOS devices 38, 40, 42 and 44. Specifically, a phase splitter 50 is provided for splitting a CMOS input into a first signal A 46 and a complementary signal $\overline{A}$ 48.

In a first phase, the signal A to the PMOS device 40 and the NMOS device 44 is high and the signal $\overline{A}$ to the PMOS device 38 and the NMOS device 42 is low. These signals causes low impedance paths from the high voltage supply Vdd to the first output line 60 via PMOS device 38 and from the low voltage supply Vss to the second output line 62 via NMOS transistor 44 to be established.

In a second phase, the signal A to the PMOS device 40 and the NMOS device 44 is low and the signal $\overline{A}$ to the PMOS device 38 and the NMOS device 42 is high. These signals causes low impedance paths from the high voltage supply Vdd to the second output line 62 via PMOS device 40 and from the low voltage supply Vss to the first output line 60 via NMOS transistor 42 to be established.

Accordingly, as a result of the application of the complementary signals A and $\overline{A}$ to the output drive devices of the bridge 32, an output signal Y is supplied on the first output line 60 by alternatively connecting the output line 60 to the high voltage supply line Vdd 16 and to the low voltage supply line Vss 18 and a complementary driven output $\overline{Y}$ is provided on line 62 by alternately connecting the output line 62 to the low voltage supply line Vss 18 and to the high voltage supply line Vdd 16 out of phase with the connection of the output line 60.

The output lines 60 and 62 are connected via a nominal resistance of 100 Ω formed by two separate resistors, each having a nominal resistance of 50 Ω. A central tap 54 between the 50 Ω resistors 56 and 58 is supplied to an error amplifier 52 which compares the error amplifier to a common mode reference voltage 64 supplied from an EUSCIBIAS circuit 68. This establishes a nominal common mode reference using a reference bias resistance 70. The EUSCIBIAS circuit 68 also provides output current control signals 66 to the error amplifier 52. The error amplifier 52 is responsive to changes in the common mode voltage detected at the point 54 with respect to the common mode reference 64 to adjust bias currents provided by current sources 76 and 78. The DC characteristics of this off-chip output driver circuit is determined in response to the error amplifier 52 which corrects the output common mode voltage by varying the two bias currents in opposite directions and varies the two bias currents in the same direction to track the external bias resistor connected to the EUSCIBIAS circuit 68. The common mode bias point is measured, as indicated above, by monitoring the centre-tap 54 of the output resistances 56 and 58.

The provision of the bias current sources 76 and 78 results in a reduction of the available voltage differential of the differential output signals. For example, where the Vss rail is at 0 V and the Vdd rail is at 3 V, the reduction in the potential difference is to about 1.8 V.

Although the circuit described with respect to FIG. 2 does provide for correcting the common mode voltage and to track the external resistor 70, it also suffers from the problem that unwanted variations in the supply or ground levels will be translated directly into unwanted level shifts in the differential output signals Y and $\overline{Y}$.

It can thus be seen that the conventional driver stages suffer from significant disadvantages. In the CMOS design of FIG. 1, the output ports are connected directly via one saturated device to the power supply or ground so that the output stage high and low levels are sensitive to unwanted supply variation. Furthermore, circuit component manufacturing process tolerance variations also affect the output drive signal levels.

In the design of FIG. 2, although the problem of having saturated devices connecting the driven outputs to the supplies is eliminated, the control device levels are still left open and are subject to circuit component variations.

Accordingly, an aim of the invention is substantially to eliminate or at least to mitigate the problems of prior art driver circuits.

SUMMARY OF THE INVENTION

In accordance with a first aspect of the invention, there is provided a driver circuit comprising output driver circuitry, monitor circuitry for deriving control signals related to driven signal levels, and supply circuitry responsive to the control signals for controlling (i.e. stabilising) the supply voltage applied to the output driver circuitry.

An embodiment of the invention enables the stabilisation of the DC output voltages and permits the generation of precision output voltages independent of AC operation, power supply noise and electromagnetic interference (EMI).

The monitor circuitry can be connected to monitor voltages at a supply input of the output driver circuitry where there is a linear relationship between the supply voltage input to the output driver and the resulting driven signal level. This is typically the case where the output driver comprises one or more field effect transistors driven to saturation. Alternatively, the monitor circuitry can be connected directly to monitor driven output levels from the output driver circuitry.

Preferably, the monitor circuitry comprises an error amplifier for comparing monitored voltage levels to at least one reference voltage level to derive the control signals in response to the comparison.

Preferably, the supply circuitry comprises an active current source (e.g. a nonsaturated active field effect transistor) having a control input for receiving the control signals, the current source being connected between a voltage supply input of the output driver circuitry and a supply rail.

A source of at least one output reference voltage is preferably provided for the monitor circuitry.

Preferably, the driver circuit comprises: first and second output drivers each having a supply input, a drive input and a driven output; monitor circuitry deriving a first control signal related to an output drive level for the first output driver and deriving a second control signal related to an output drive level for the second output driver; supply circuitry responsive to the first control signal actively to control the supply voltage at the supply input of the first output driver and responsive to the second control signal actively to control the supply voltage at the supply input of the second output driver.

In such a driver circuit, first monitor circuitry can be connected to monitor the voltage at the supply input of the first output driver for deriving the first control signal, the driven output of the first output driver being related to the voltage at the supply input of the first output driver and second monitor circuitry can connected be to monitor the voltage at the supply input of the second output driver for deriving the second control signal, the driven output of the second output driver being related to the voltage at the supply input of the second output driver.

Alternatively, first monitor circuitry can be connected to monitor a driven output level from the first output driver for deriving the first signal and second monitor circuitry can be connected to monitor a driven output level from the second output driver for deriving the second signal. In this arrangement, a first rectifier can be arranged to rectify a driven output level from the first output driver before being passed to the first monitor circuitry and a second rectifier can be arranged to rectify a driven output level from the second output driver before being passed to the second monitor circuitry. Alternatively, the first and second monitor circuits are arranged alternately to be activated in accordance with the driving of the first and second output drives, respectively.

The monitor circuitry can comprises a first operational amplifier for comparing a monitored voltage from the first output driver to a first reference voltage for deriving the first signal and a second operational amplifier for comparing a monitored voltage from the second output driver to a second reference voltage for deriving the second signal.

A source of high and low output references for the monitor circuitry can be provided internally to an integrated circuit including the driver circuit, although the driver circuit can be provided separately from the integrated circuit.

The invention can be implemented for a single driver stage, but finds particular application to circuits including a plurality of driver stages, that is with a plurality of sets of output driver circuitry.

In such an arrangement, monitor circuitry common to the plurality of driver stages can be provided for deriving a first common signal proportional to an output drive level for a first output driver and a second common signal proportional to an output drive level for a second output driver.

Further, although separate supply circuitry can be provided for each driver stage, common supply circuitry can be responsive to the first signal actively to control the supply voltage at the supply voltage input of each first output driver and responsive to the second signal actively to control the supply voltage at the supply voltage input of each second output driver.

In a CMOS implementation, the first and second output drivers can comprise first and second field effect transistors arranged in series between high and low voltage supply lines and connected to supply a single driven output signal on a single output line.

In an implementation for providing differential signals, said first and second output drivers can comprise first and second pairs of complementary field effect transistors arranged between high and low voltage supply lines and connected to supply complementary signals on first and second output lines.

The invention also provides an integrated circuit including driver circuitry as defined above.

BRIEF DESCRIPTION OF THE DRAWINGS

Exemplary embodiments of the invention will be described hereinafter, by way of example only, with reference to the accompanying drawings in which.

DESCRIPTION OF THE PREFERRED EMBODIMENTS

Figure 3:
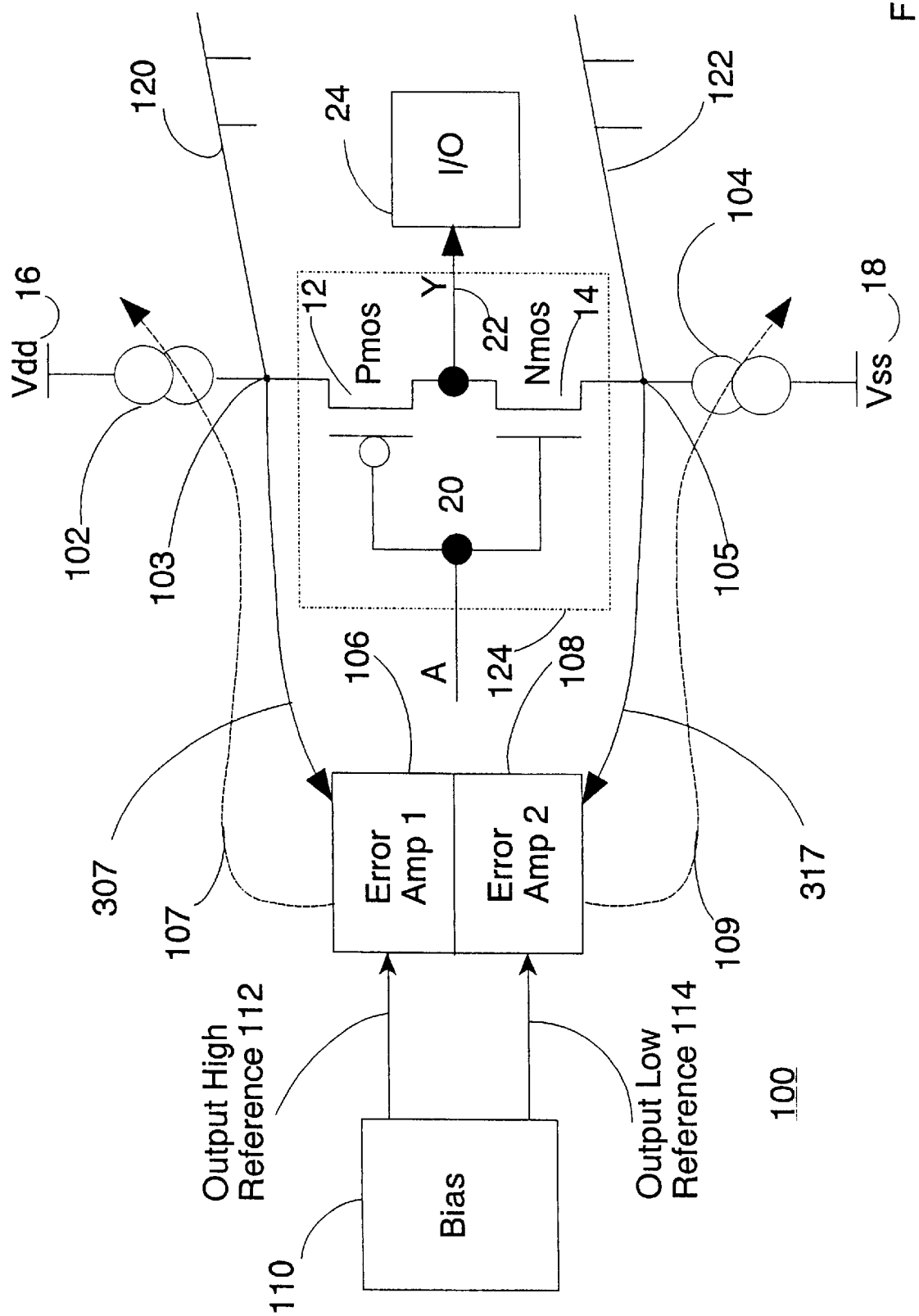
FIG. 3 is a schematic diagram of a first embodiment of the present invention.

FIG. 3 is a first embodiment 100 of the present invention. It will be noted in this embodiment that the final output signal is never connected via a saturated output driver to either supply or to ground, but instead a second device is connected in series between the supply and the output driver stage and is also connected via a DC server loop, suppressing unwanted supply and process variations on the output signal.

Figure 1:
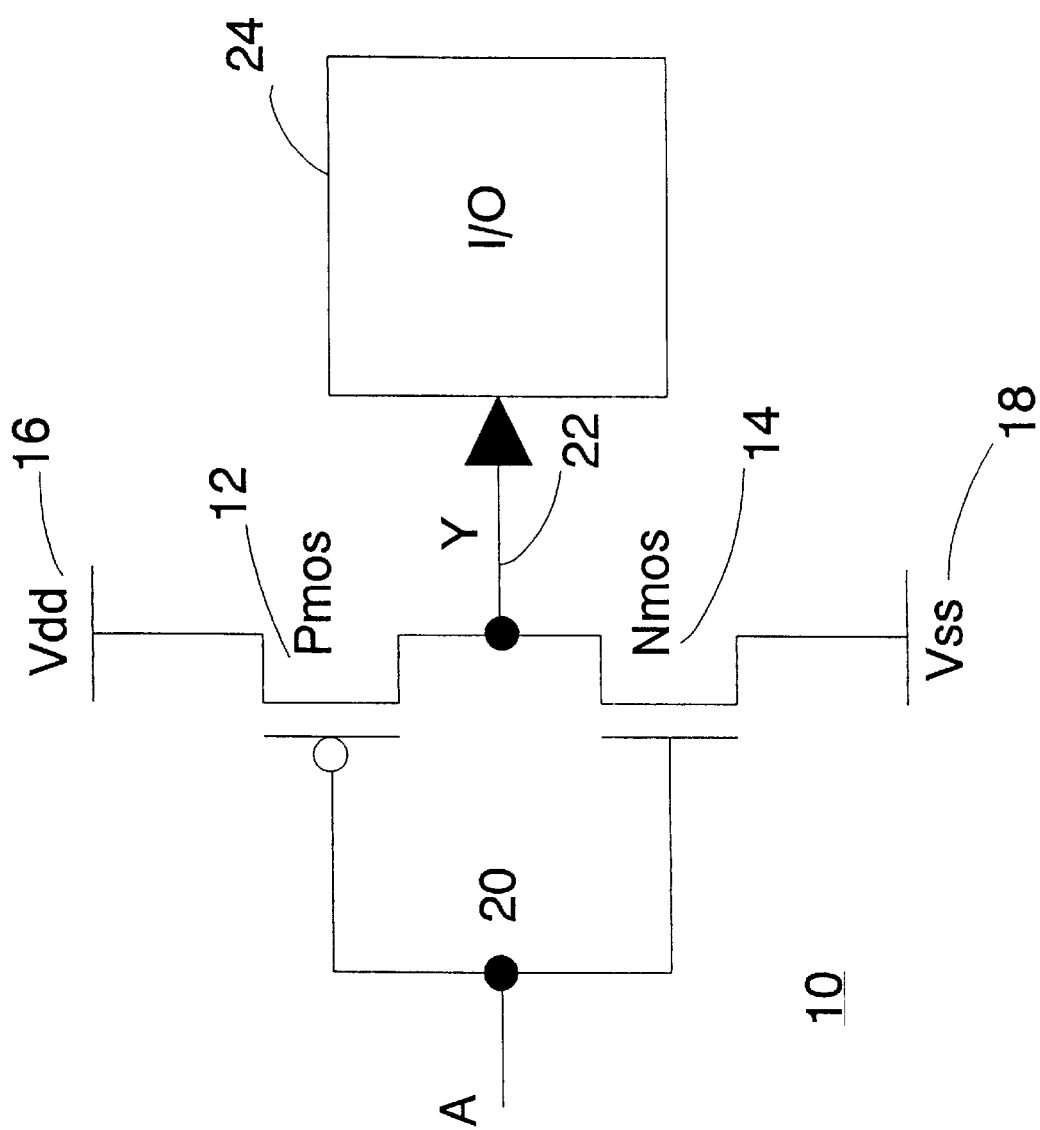
FIG. 1 is a schematic diagram of a conventional CMOS output driver stage.

In FIG. 3, it will be noted that an arrangement similar to that of FIG. 1 is provided, including a first output driver (here a PMOS transistor) 12 and a second output driver (here an NMOS transistor) 14, the input signal A supplied at an input node 20 and the output signal Y being supplied at an output line 22. However, in the present embodiment, rather than the supply side of the PMOS driver transistor 12 and the NMOS driver transistor 14 being connected directly to the high voltage supply Vdd 16 and the low voltage supply Vss 18, respectively, they are instead connected to those supply lines via a respective current supplies 102 and 104. Each of the current supplies 102 and 104 is preferably configured as a non-saturated active device. For example, the current supply 102 is preferably implemented by a nonsaturated active PMOS transistor and the current supply 104 is preferably implemented by a non-saturated active NMOS transistor.

In the embodiment of FIG. 3, first and second error amplifiers 106 and 108 are provided.

The error amplifier 106 monitors the level of the signal at the point 103 between the current supply device 102 and the output driver device 12. The error amplifier 106 compares the fed back voltage level measured at the point 103 to an output high reference value 112 supplied from a bias circuit 110 and determines a control signal 107 in response thereto. The control signal 107 indicating a difference between the level fed back via a line 307 from point 103 and the high reference 112 is used to vary the operation of the non-saturated current supply device 102 to adjust the DC level at the point 103 to correspond to the output high reference 112.

Similarly, the error amplifier 108 monitors the level of the signal at the point 105 between the current supply device 104 and the output driver device 14. The error amplifier 108 compares the fed back voltage level measured at the point 105 to an output low reference value 114 supplied from a bias circuit 110 and determines a control signal 109 in response thereto. The control signal 109 indicating a difference between a level fed back via line 317 from point 105 and the low reference 114 is used to vary the operation of the non-saturated current supply device 104 to adjust the DC level at the point 105 to correspond to the output low reference 114.

Accordingly, the use of the error amplifiers 106 and 108 for monitoring the voltage levels at the point 103 and 105, respectively, can be used to stabilise those voltage levels 103 and 105, and consequentially to provide stabilised high and low values for the output driven signal Y. Although the error amplifiers 106 and 108 do not directly observe the output DC levels of the driven signal Y, monitoring the voltage levels at the point 103 and 105 is effectively equivalent to monitoring the high and low levels of the output driven signal Y modified by an "offset" corresponding to the drain-source voltage (saturation) of the output stage drivers 12 and 14. In the circuit of FIG. 3, this offset is compensated for by adjusting the output high reference and output low references 112 and 114 by near identical values before subtraction by the respective error amplifiers.

It will be noted that the insertion of the current supply transistors 102 and 104 causes a permanent voltage drop to be lost across the non-saturated active devices so that the maximum output drive levels are reduced compared to the circuit 10 of FIG. 1, assuming the same basic Vdd and Vss voltages. For example, if Vdd is 3 V and Vss is 0 V, the maximum drive levels are reduced to a range of about 0.6 V to 2.4 V. However, the advantages of the arrangement of FIG. 3 can surprisingly outweigh the disadvantages as a result of the increased reliability of operation. It is possible to provide a local termination with a resistor of a known value, which leads to better impedance matching of the transmission lines. Also, the output has a known amplitude (given the known load) and can be controlled to reduce electromagnetic radiation.

Although the arrangement of FIG. 3 requires significant more circuitry than for the simple output driver stage of FIG. 1, the additional circuitry including the error amplifiers, the current supply transistors and the bias circuit can advantageously be used in common for a plurality of output driver stages where a plurality of output driver stages are provided. This is represented schematically in FIG. 3 by means of the lines 120 and 122, which are intended to represent the connection in parallel of a plurality of output driver stages (each including the circuitry shown within the dot-dash line 124) at the points 103 and 105.

Figure 2:
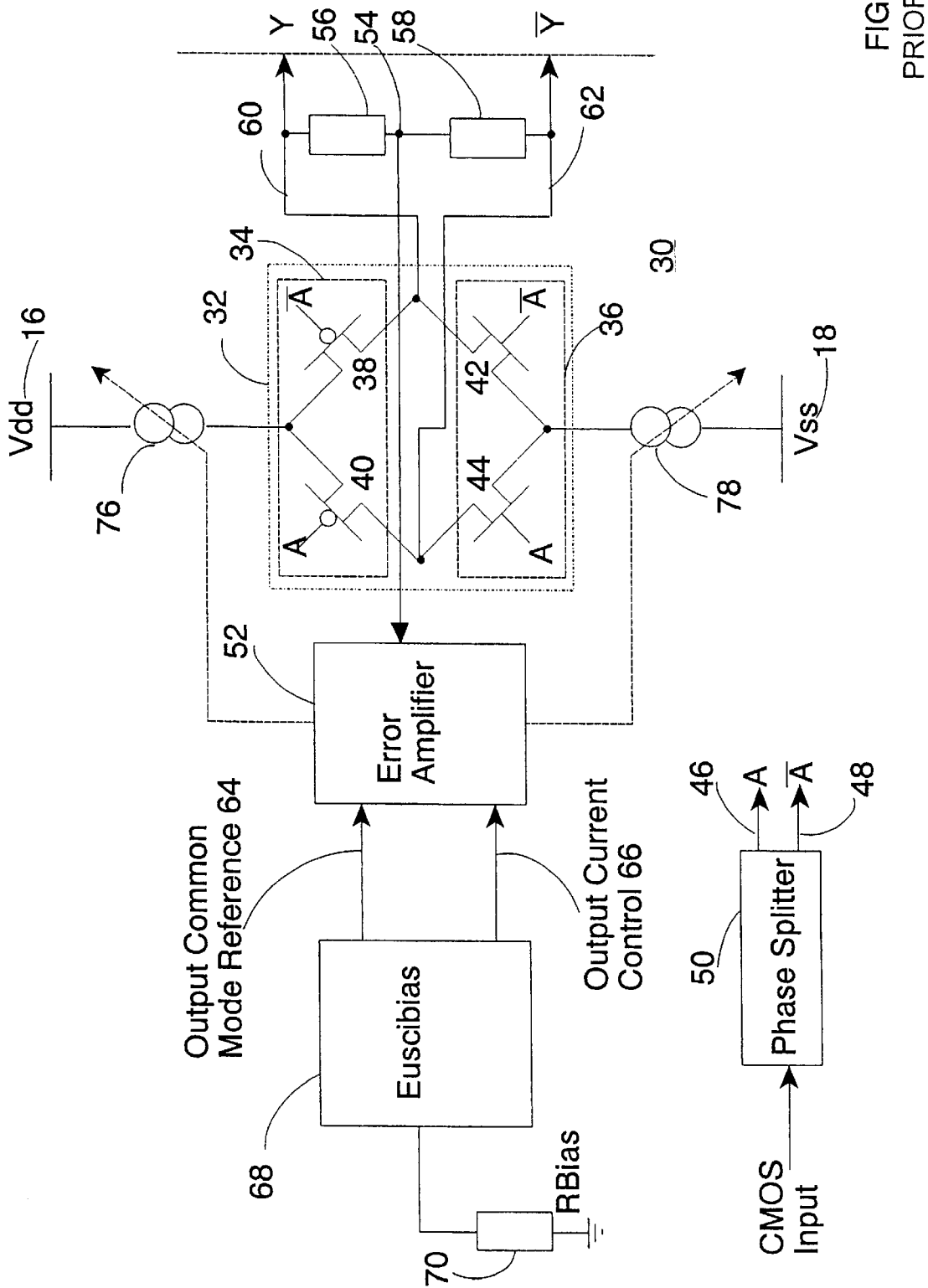
FIG. 2 is a schematic block diagram of a proposed high speed output driver circuit for differential output signals.
Figure 4:
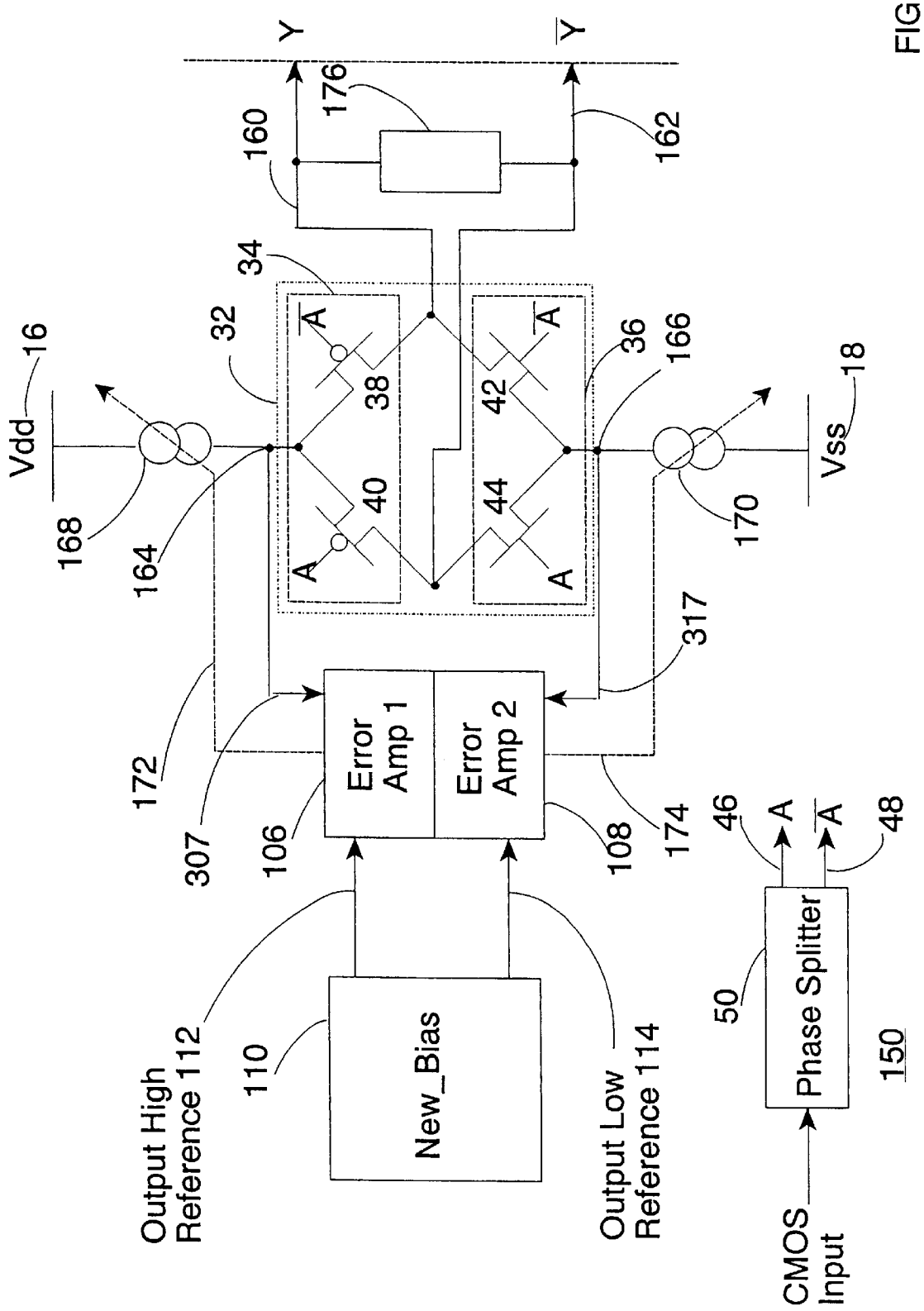
FIG. 4 is a second embodiment of the present invention.

FIG. 4 is a schematic diagram representing the application of the present invention to a differential driver state 150 of the type shown in FIG. 2. As in FIG. 2, a bridge arrangement 32 comprises a first output driver 34 formed by a pair of PMOS output drive devices 3& and 40 and a second output driver 36 formed by a pair of NMOS output drive devices 42 and 44. A first PMOS device 38 is connected between the supply line 16 and a first output line 160. A second PMOS device 40 is connected between the high voltage supply line 16 and a second output line 162. A first NMOS device 42 is connected between the low voltage supply line 18 and the first output line 160. A second NMOS device 44 is connected between the low voltage supply line 18 and the second output line 162. Signals A and $\overline{A}$ are provided for controlling the PMOS and NMOS devices 38, 40, 42 and 44. Specifically, a phase splitter 50 is provided for splitting a CMOS input into a first signal A 46 and a complementary signal $\overline{A}$ 48.

In a first phase, the signal A to the PMOS device 40 and the NMOS device 44 is high and the signal $\overline{A}$ to the PMOS device 38 and the NMOS device 42 is low. These signals causes low impedance paths from the high voltage supply Vdd to the first output line 160 via PMOS device 38 and from the low voltage supply Vss to the second output line 162 via NMOS transistor 44 to be established.

In a second phase, the signal A to the PMOS device 40 and the NMOS device 44 is low and the signal $\overline{A}$ to the PMOS device 38 and the NMOS device 42 is high. These signals causes low impedance paths from the high voltage supply Vdd to the second output line 162 via PMOS device 40 and from the low voltage supply Vss to the first output line 160 via NMOS transistor 42 to be established.

Accordingly, as a result of the application of the complementary signals A and $\overline{A}$ to the output drive devices of the bridge 32, an output signal Y is supplied on the first output line 160 by alternatively connecting the output line 60 to the high voltage supply line Vdd 16 and to the low voltage supply line Vss 18 and a complementary driven output $\overline{Y}$ is provided on line 162 by alternately connecting the output line 162 to the low voltage supply line Vss 18 and to the high voltage supply line Vdd 16 out of phase with the connection of the output line 160.

However, the circuit of FIG. 4 does not include the common mode voltage control arrangement of FIG. 2, but instead a control arrangement providing separate control of the supply voltages to the output drivers in the manner of FIG. 3.

In FIG. 4, the first output line 160 is connected to a junction between the PMOS transistor 38 and the NMOS transistor 42. A second output line 162 is connected to a junction between the PMOS transistor 40 and the NMOS transistor 44. A junction 164 between the PMOS transistors 38 and 40 is connected to the high voltage supply line 16 via a non-saturated active device 168 (preferably a non-saturated active PMOS transistor). A junction 166 between the NMOS transistors 42 and 44 is connected to the low voltage supply line 18 via a current source 170 (preferably a non-saturated active device such as an NMOS transistor).

As in the circuit of FIG. 3, first and second error amplifiers 106 and 108 are provided. The error amplifier 106 is used to monitor the voltage level at the junction point 164 via line 307 and to compare this to an output high reference 112 from the bias circuit 110. Similarly, the error amplifier 108 is used to monitor the voltage level at the junction 166 via line 317 and to compare this to an output low reference 114 from the bias circuit 110.

Any difference between the voltage level at the junction 164 and the output high reference 112 results in a signal 172 which is used to control the nonsaturated active device 168 to adjust the voltage level at the junction 164. Similarly, any difference between the voltage level at the junction 166 and the output low reference 114 results in a signal 174 which is used to control the non-saturated active device 170 to adjust the voltage level at the junction 166.

It will be noted, therefore, that the error amplifiers 106 and 108 monitor the junction points 164 and 166 to adjust the supply voltages to the output driver devices with the high and low voltage levels being adjusted independently. It will be noted in the circuit of FIG. 4 that a single resistor 176, nominally 100 Ω, can be provided between the output lines 160 and 162 as the first and second error amplifiers monitor the voltage levels at the junctions 164 and 166, respectively. Accordingly, it is no longer necessary to monitor a centre tap voltage in the manner of the FIG. 2 circuit.

Figure 7:
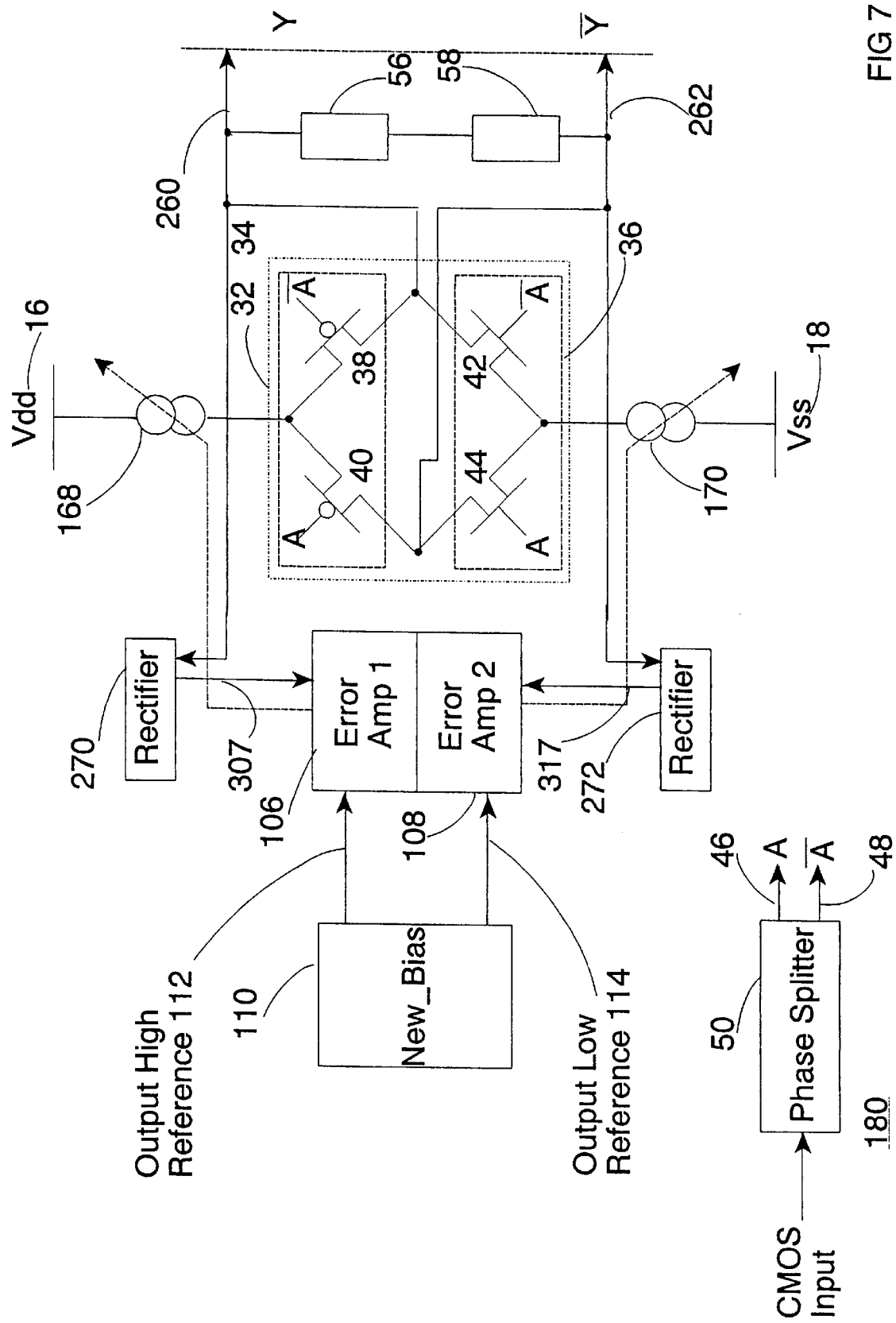
FIG. 7 is a third embodiment of the present invention.

It will be noted that the error amplifiers 106 and 108 do not directly observe the output DC levels of the driven signals Y and $\overline{Y}$, but instead observe an "offset" value, offset by the drain-source voltage (saturation) of the output stage drivers. In the circuit of FIG. 4, this offset is compensated for by adjusting the output high reference 112 and output low reference 114 by near identical values before subtraction by the error amplifier. This "offset" can introduce small perturbations in the accuracy of operation of the device. FIG. 7 relates to a further embodiment which addresses this matter.

Figure 5A:
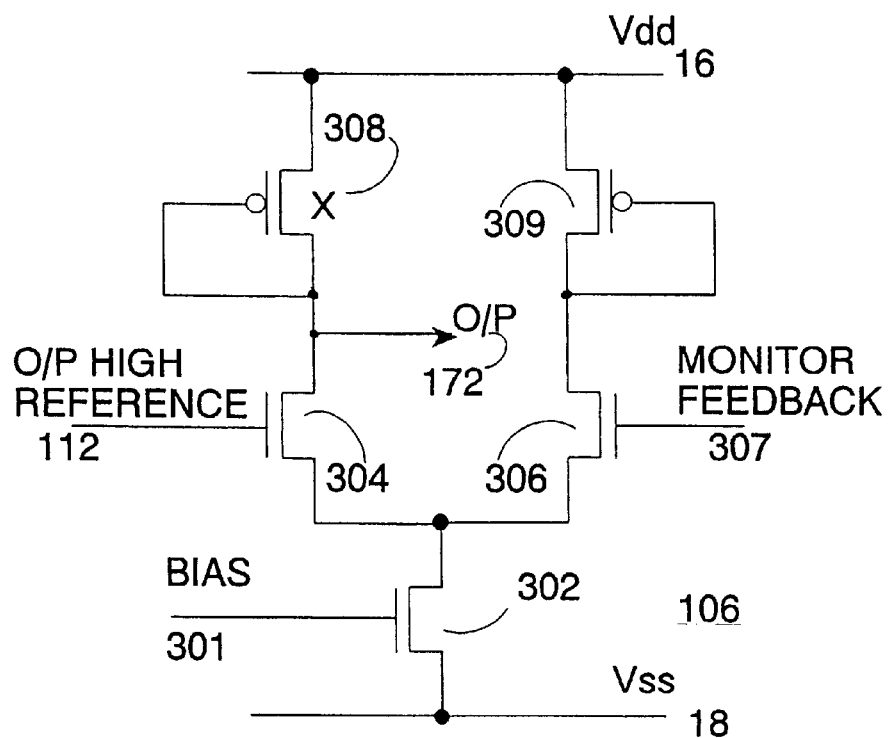
FIGS. 5A and 5B illustrate examples of circuits for implementing error amplifier circuits.

FIG. 5A is an example of an implementation of the first error amplifier 106. The first error amplifier 106 includes first and second P-channel field effect transistors (PMOS transistors) 308 and 309 connected as current sources to the high voltage supply line Vdd 16. The first current source transistor 308 is connected to an NMOS transistor 304, which forms a reference signal input transistor, the gate of which is connected to receive the high reference 112. The junction between the first current source transistor 308 and the reference signal input transistor 304 forms the output control signal line 172. The second current source transistor 309 is connected to an NMOS transistor 306, which forms a monitor signal input transistor, the gate of which is connected to receive the monitor signal 307 (in FIG. 4 fed back from the junction point 164). The reference input transistor 304 and the monitor signal transistor 306 are also connected to the low voltage supply line 18 via a bias transistor 302. The gate of the bias transistor 302 is connected to receive a bias input 301. The effect of the error amplifier 106 is to compare the monitor voltage from point 164 to the high reference signal 112.

Figure 5B:
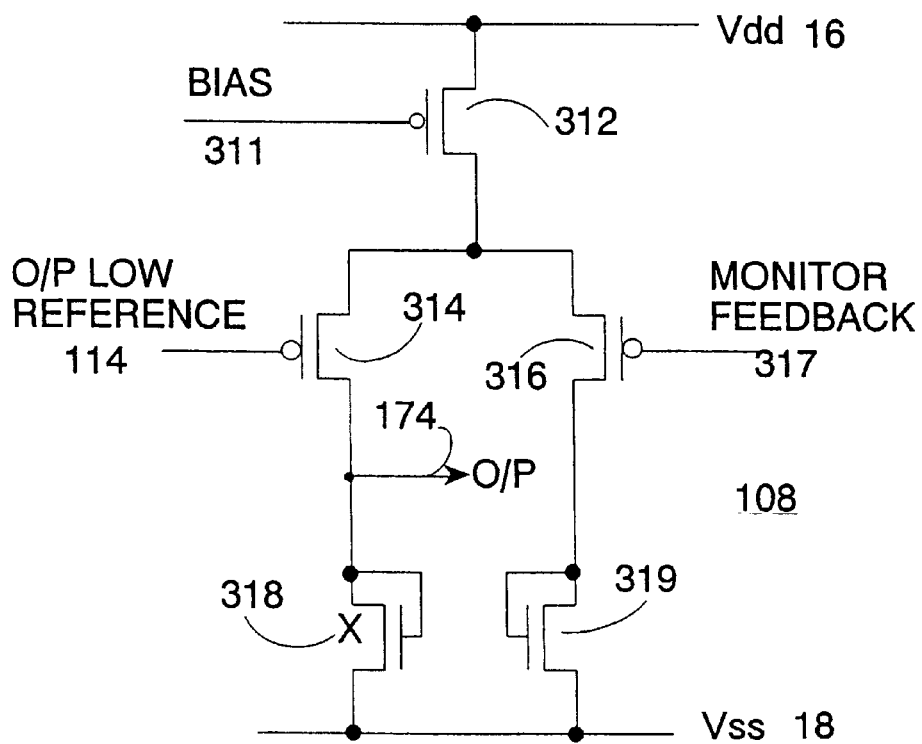

FIG. 5B is an example of an implementation of the second error amplifier 108. The second error amplifier 108 includes first and second NMOS transistors 318 and 319 connected as current sources to the low voltage supply line Vss 18. The first current source transistor 318 is connected to a PMOS transistor 314, which forms a reference signal input transistor, the gate of which is connected to receive the low reference 114. The junction between the first current source transistor 318 and the reference signal input transistor 314 forms the output control signal line 174. The second current source transistor 319 is connected to a PMOS transistor 316, which forms a monitor signal input transistor, the gate of which is connected to receive the monitor signal 317 (in FIG. 4 fed back from the junction point 166). The reference input transistor 314 and the monitor signal transistor 316 are also connected to the high voltage supply line 16 via a bias transistor 312. The gate of the bias transistor 312 is connected to receive a bias input 311. The effect of the error amplifier 108 is to compare the monitor voltage from point 166 to the low reference signal 114.

Figure 6A:
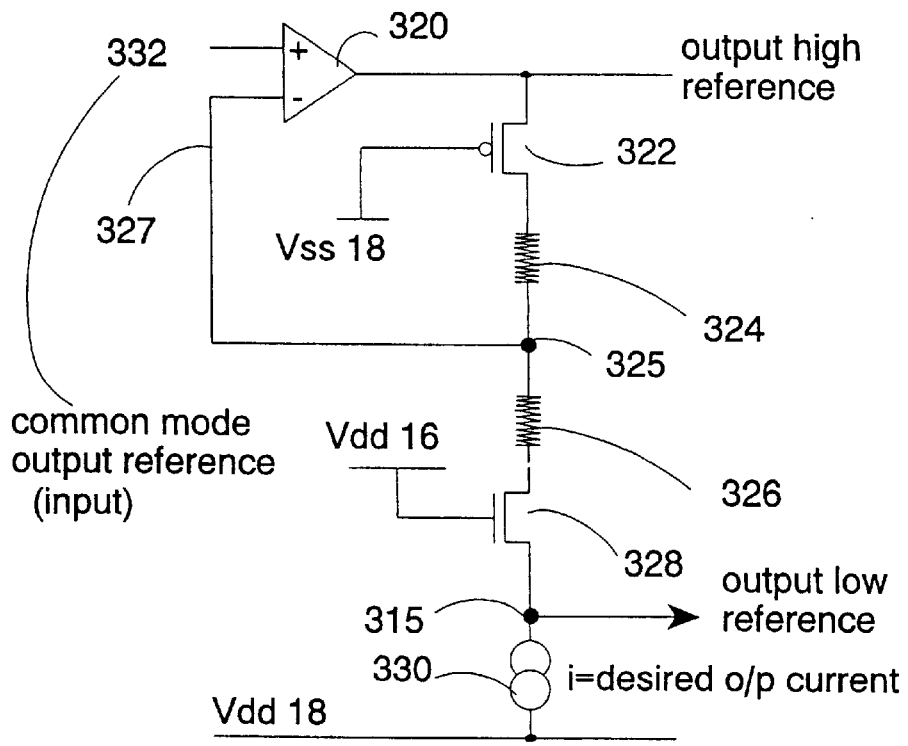
FIGS. 6A and 6B illustrate examples of bias circuits.

FIG. 6A is one example of a circuit for implementing the new bias circuit 110. In this circuit, a common mode output reference signal 332 is input to an operational amplifier 320, the output of which is connected to form the output high reference signal 112. The output of the operational amplifier 320 is also connected to a PMOS transistor 322. The gate of the transistor 332 is connected to the low voltage supply line Vss 18. The transistor 332 is also connected to a first of two series connected 50 ohm resistors 324 and 326. The junction 325 between the resistors 324 and 326 is fed back to a second input of the operational amplifier 320. The second transistor 326 is connected to an NMOS transistor 328. The gate of the NMOS transistor 328 is connected to the high voltage supply line Vdd 16. The NMOS transistor 328 is connected via a current source 330, which defines a desired output current, to the low voltage supply line 18. The output low reference 114 is provided at the junction 315 between the transistor 328 and the current source 330. In this circuit, a known current is forced through a known resistor which is in series with the NMOS transistor and PMOS transistor devices. The output high reference is therefore equal to Vcommon_mode+Iref+Vdsp. The output low reference is therefore equal to Vcommon_mode−Iref−Vdsn. Vdsp and Vdsn are the respective voltage drops corresponding to the wanted voltage drop across the transistors 40 38 and 44. 42 in FIG. 4.

Figure 6B:
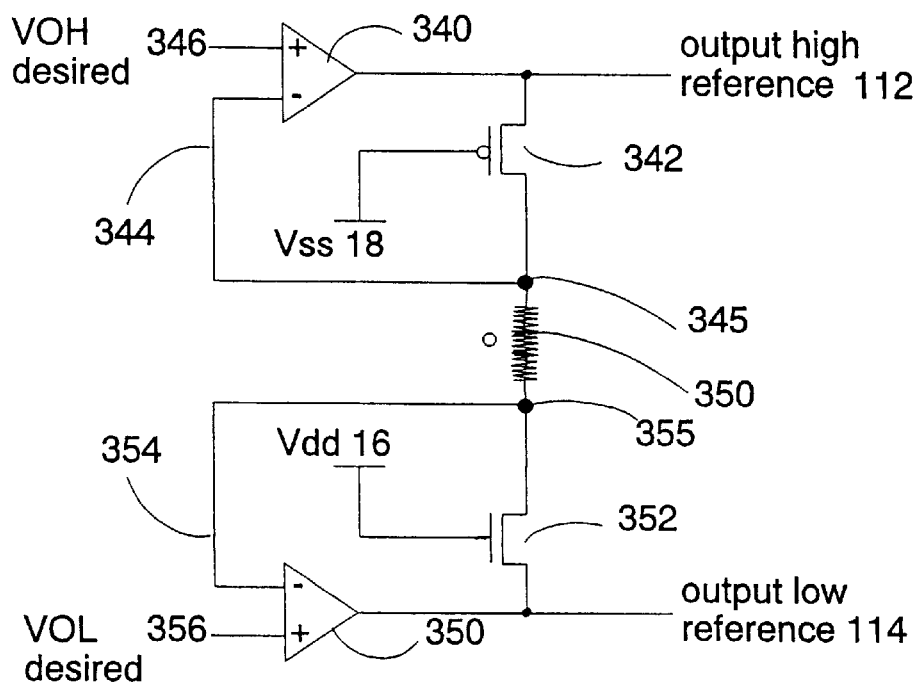

FIG. 6B is one example of another circuit for implementing the new bias circuit 110. In this circuit, a desired Voh signal 346 is input to an operational amplifier 340, the output of which is connected to form the output high reference signal 112. The output of the operational amplifier 340 is also connected to a PMOS transistor 342. The gate of the transistor 342 is connected to the low voltage supply line 18.

The transistor 342 is also connected to a 100 Ohm resistor 350. The junction 345 between the transistor 342 and the resistor 350 is fed back to a second input of the operational amplifier 340. A desired Vol signal 356 is input to an operational amplifier 350, the output of which is connected to form the output low reference signal 114. The output of the operational amplifier 350 is also connected to an NMOS transistor 352. The gate of the transistor 352 is connected to the low voltage supply line 18. The transistor 352 is also connected to the 100 Ohm resistor 350. The junction 355 between the transistor 352 and the resistor 350 is fed back to a second input of the operational amplifier 350. This circuit works in a similar way to the circuit of FIG. 6A in that current is passed through the series connected devices, only this time the current is set by the fact that one end of the reference resistor is held at Voh and the other at Vol. The current is therefore (Voh–Vol)/100.

FIG. 7 illustrates a further embodiment of the invention which provides a further improvement over the circuit of FIG. 4. This embodiment comprises much in common with the embodiment of FIG. 4. Accordingly, only the differences between these embodiments will be described. In the embodiment of FIG. 5, the output voltage levels of the signals Y and $\overline{Y}$ are measured directly rather than the voltages at the junctions 164 and 166. However, as the voltages being output on the lines 260 and 262 in FIG. 7 are alternating, the signals are rectified before being input to the error amplifiers 106 and 108.

In particular, a first voltage level is detected on the output line 260 and is supplied to a first rectifier 270 before the rectified signal is applied to the error amplifier 106. Also, the signal $\overline{Y}$ is monitored on line 262 and is supplied to a negative rectifier 272 from which a negative rectified signal is applied to the error amplifier 108.

As an alternative to rectification, the error amplifiers could be switched in accordance with the clock signals A and $\overline{A}$.

As the driven output signals are measured directly, it is not necessary to adjust the output high reference 112 and output low reference 114 to compensate for the offset described with reference to FIG. 4.

It can be seen that the circuit of FIG. 7 corresponds to that of FIG. 4 with the exception that the output driven differential signals are monitored directly rather than monitoring a signal which is proportional to those signals. Also, in FIG. 7, two separate 50 Ω resistors 56 and 58 are provided.

It will be appreciated that as for the FIG. 3 embodiment, it is possible to control the supply voltages input to a plurality of driver stages by monitoring one driver stage in accordance with the approach of FIG. 4 or FIG. 7 using a common pair of error amplifiers, and then using the derived control signal to control current supply devices supplying a control voltage to a plurality of driver stages in parallel at the points 164 and 166 in FIGS. 4 and 7.

Figure 8:
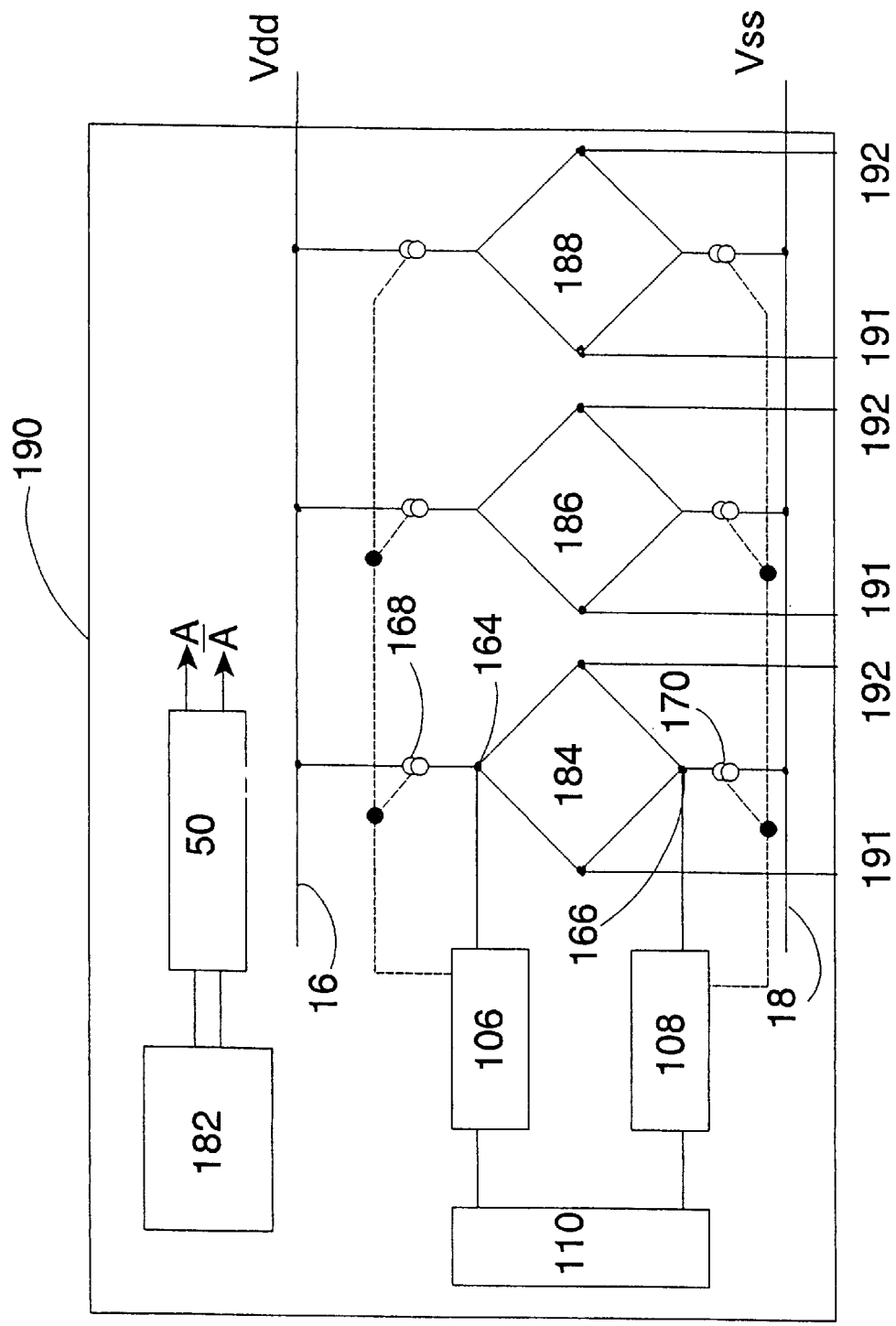
FIG. 8 is a schematic representation of an integrated circuit including a driver circuit in accordance with the invention.

FIG. 8 is a schematic representation of an integrated circuit including output driver circuits in accordance with FIG. 4. It will be noted that the integrated circuit 190 is shown to comprise internal processing circuitry 182, which may take whatever form is appropriate for a specific application of the invention and a plurality of (here three) differential mode output driver stages 184, 186, 188, each having first and second outputs 191 and 192. As shown schematically in FIG. 6, the reference points 164 and 166 of the output driver stage 184 is monitored by error amplifiers 106 and 108. Control signals are used to control current supply devices 168 and 170 to control the voltage level applied to the points 164 and 166 of each of the driver stages 184, 186 and 188 in parallel.

It will be appreciated that other embodiments of an integrated circuit could be based on different implementations of the driver circuits, for example the embodiment of FIG. 3 or 7. Also, other numbers of driver stages (1, 2 or more, even significantly more than 3 driver stages) can be provided in a circuit. Moreover, rather than monitoring only one driver stage to determine the control signals, a plurality of driver stages could be modified and the result could be averaged, for example. Also, each driver stage could be provided with its own set of error amplifiers and current supply devices.

Accordingly, it will be appreciated that although particular embodiments of the invention have been described, many modifications and or additions may be made within the spirit and scope of the invention. For example, although in the embodiments of the invention P and N type MOSFET devices have been described for certain components, different device types and circuit technologies may be used in other embodiments.

What is claimed is:

1. A driver circuit comprising:

first and second output drivers each having a supply input, a drive input and a driven output;

monitor circuitry deriving a first control signal related to an output drive level for said first output driver and deriving a second control signal related to an output drive level for said second output driver; and supply circuitry responsive to said first control signal actively to control the supply voltage at said supply input of said first output driver and responsive to said second control signal actively to control a supply voltage at said supply input of said second output driver.

2. A driver circuit according to claim 1 wherein said monitor circuitrs comprises:

a first monitor circuit connected to monitor the voltage at said supply input of said first output driver for deriving said first control signal, said driven output of said first output driver being related to said voltage at said supply input of said first output driver; and a second monitor circuit connected to monitor the voltage at said supply input of said second output driver for deriving said second control signal, said driven output of said second output driver being related to said voltage at said supply input of said second output driver.

3. A driver circuit according to claim 2, wherein:

said first monitor circuitry is connected to monitor a driven output level from said first output driver for deriving said first signal; and said second monitor circuit is connected to monitor a driven output level from said second output driver for deriving said second signal.

4. A driver circuit according to claim 3, further comprising:

a first rectifier arranged to rectify a driven output level from said first output driver before being passed to said first monitor circuitry; and a second rectifier arranged to rectify a driven output level from said second output driver before being passed to said second monitor circuitry.

5. A driver circuit according to claim 3, wherein said first and second monitor circuits are arranged alternately to be activated in accordance with the driving of said first and second output drivers, respectively.

6. A driver circuit according to claim 1, wherein said monitor circuitry comprises:
- a first operational amplifier for comparing a monitored voltage from said first output driver to a first reference voltage for deriving said first signal; and
- a second operational amplifier for comparing a monitored voltage from said second output driver to a second reference voltage for deriving said second signal.

7. A driver circuit according to claim 1, further comprising a source of high and low output references for said monitor circuitry.

8. A driver circuit according to claim 1, wherein said supply circuitry comprises first and second constant current sources, said first constant current source being located between a high voltage supply line and said supply input of said first output driver and a second current source being located between a low voltage supply line and said supply input of said second output driver.

9. A driver circuit according to claim 1, wherein said first and second output drivers comprise first and second field effect transistors arranged in series between high and low voltage supply lines and connected to supply a single driven output signal on an output line.

10. A driver circuit according to claim 1, wherein said first and second output drivers comprise first and second pairs of complementary field effect transistors arranged between high and low voltage supply lines and connected in a bridge to supply differential signals on first and second output lines.

* * * * *